United States Patent
Yu

(10) Patent No.: US 10,586,940 B2
(45) Date of Patent: Mar. 10, 2020

(54) ORGANIC LIGHT EMITTING DIODE SUBSTRATE AND PREPARATION METHOD THEREOF, AND DISPLAY PANEL

(71) Applicant: BOE Technology Group Co., Ltd., Beijing (CN)

(72) Inventor: Donghui Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/007,188

(22) Filed: Jun. 13, 2018

(65) Prior Publication Data
US 2019/0207149 A1 Jul. 4, 2019

(30) Foreign Application Priority Data

Jan. 3, 2018 (CN) .......................... 2018 1 0006118

(51) Int. Cl.
| | |
|---|---|
| H01L 51/00 | (2006.01) |
| H01L 51/52 | (2006.01) |
| H01L 27/32 | (2006.01) |
| H01L 51/56 | (2006.01) |

(52) U.S. Cl.
CPC ...... *H01L 51/5228* (2013.01); *H01L 27/3246* (2013.01); *H01L 51/0015* (2013.01); *H01L 51/0022* (2013.01); *H01L 51/56* (2013.01); *H01L 2227/323* (2013.01); *H01L 2251/556* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 2011/0156084 A1* | 6/2011 | Choi | .................. H01L 51/5203 257/99 |
| 2013/0249384 A1* | 9/2013 | Sawabe | ................. H01L 51/524 313/504 |

FOREIGN PATENT DOCUMENTS

| | | |
|---|---|---|
| CN | 102821543 A | 12/2012 |
| CN | 103311265 A | 9/2013 |
| CN | 104821368 A | 8/2015 |

OTHER PUBLICATIONS

First office action of Chinese application No. 201810006118.3 dated Dec. 17, 2019.

\* cited by examiner

*Primary Examiner* — Bradley Smith
(74) *Attorney, Agent, or Firm* — Fay Sharpe LLP

(57) ABSTRACT

There provide an organic light emitting diode substrate and preparation method thereof and a display panel. The preparation method includes: forming a pixel defining layer which defines a pixel region and has a via hole on a base; forming an auxiliary electrode in the via hole; forming a capsule structure encapsulating a conductive liquid on the auxiliary electrode; expanding the capsule structure to be broken so as to enable the conductive liquid to form a connection electrode; and forming a first electrode covering the base, the first electrode being connected to the auxiliary electrode through the connection electrode. In the present disclosure, the connection electrode is formed through the capsule structure encapsulating the conductive liquid, so that the first electrode is connected to the auxiliary electrode through the connection electrode. The preparation process is simpler and the production cost is lower.

11 Claims, 9 Drawing Sheets

ORGANIC LIGHT EMITTING DIODE SUBSTRATE AND PREPARATION METHOD THEREOF, AND DISPLAY PANEL

CROSS-REFERENCE TO RELATED APPLICATION

This application claims priority to Chinese Patent Application No. 201810006118.3, filed with the State Intellectual Property Office on Jan. 3, 2018, the entire contents of which are incorporated herein by reference.

TECHNICAL FIELD

The present disclosure relates to an organic light emitting diode substrate and preparation method thereof, and a display panel.

BACKGROUND

CRT (Cathode Ray Tube) displays have been gradually replaced by LCD (Liquid Crystal Display) devices and OLED (Organic Light Emitting Diode) display devices in the technical field of display. The OLED display device is expected to become the core display in the next generation of flat panel display technology by virtue of its advantages of being active in light emitting, quick in response, wide in viewing angle, high in brightness and color saturation, low in cost, light, thin and flexible, etc. Based on light emitting directions, OLEDs are classified into bottom-emission OLEDs (namely, emitting light downwards relative to the substrates), top-emission OLEDs (namely, emitting light upwards relative to the substrates), and other OLEDs. As the top-emission OLED has the advantages of a high aperture ratio and color purity, easiness in achievement of a high resolution (Pixels per inch, (PPI)), and the like, it has become a mainstream organic electroluminescent device structure at present.

The OLED is a current driving component mainly composed of a second electrode, a light emitting function layer, and a first electrode which are sequentially away from a substrate. As a light emitting direction of the top-emission OLED is located at one side of the first electrode, the first electrode is required to have higher light transmittance and conductivity. The first electrode is generally made of a single metal and/or an alloy material with a low work function, so a light transmittance rate of the first electrode is smaller. Thus, in order to reduce the influence of the first electrode on the light emitting rate, the first electrode is required to be very thin. However, the resistance of the thinner first electrode is larger, which will cause an obvious voltage drop (IR Drop). As a result, emitted light is non-uniform due to non-uniform voltage distribution on the first electrode, and accordingly, power consumption is increased.

In order to solve the problem, a solution in which an auxiliary electrode is arranged on an array substrate had been provided. According to the solution, the auxiliary electrode with a lower resistance is connected to the first electrode to reduce the voltage drop and increase the uniformity of emitted light.

SUMMARY

The present disclosure provides an organic light emitting diode substrate and preparation method thereof, and a display panel.

In a first aspect, there is provided an organic light emitting diode substrate, including a base, and a pixel defining layer which is configured to define a plurality of pixel regions on the base and comprises a via hole; an auxiliary electrode whose orthographic projection region on the base is located in an orthographic projection region of the via hole on the base; a connection electrode comprising a conductive liquid; and a first electrode connected to the auxiliary electrode through the connection electrode.

Optionally, the organic light emitting diode substrate further includes: at least one blocking structure whose orthographic projection region on the base is located in an orthographic projection region of the via hole on the base, and the blocking structure is arranged to surround the auxiliary electrode.

Optionally, the distance from the surface of the blocking structure away from the base to the base is a first distance; the distance from the surface of the pixel defining layer away from the base to the base is a second distance; and the first distance is shorter than the second distance.

Optionally, the surface of the blocking structure away from the base is concave-convex.

Optionally, the organic light emitting diode substrate further includes: a second electrode and a light emitting function layer, wherein the second electrode is located in the pixel region; the light emitting function layer is located between the second electrode and the first electrode; and the connection electrode is located in the light emitting function layer.

Optionally, the distance from the surface of the blocking structure away from the base to the base is a first distance; the distance from the surface of the light emitting function layer away from the base to the base is a third distance; and the first distance is longer than the third distance.

Optionally, the thickness of the blocking structure in a direction perpendicular to the base is 10-100 nm.

Optionally, the at least one blocking structure comprises a plurality of blocking structures arranged in a shape of concentric rings.

In another aspect, there is provided a reparation method of an organic light emitting diode substrate, comprising: forming a pixel defining layer which defines a pixel region and has a via hole on a base; forming an auxiliary electrode in the via hole; forming a capsule structure encapsulating a conductive liquid on the auxiliary electrode; expanding the capsule structure to be broken so as to enable the conductive liquid to form a connection electrode; and forming a first electrode covering the base, the first electrode being connected to the auxiliary electrode through the connection electrode.

Optionally, after forming the pixel defining layer which defines the pixel region and has the via hole on the base, the method further comprises: forming a blocking structure in the via hole on the base, the blocking structure surrounding the auxiliary electrode.

Optionally, the distance from the surface of the blocking structure away from the base to the base is a first distance, the distance from the surface of the capsule structure away from the base to the base is a fourth distance, and the first distance is longer than the fourth distance.

Optionally, after forming the pixel defining layer which defines the pixel region and has the via hole on the base, the method further comprises: forming a second electrode located in the pixel region on the base; and forming a light emitting function layer on the base with the capsule structure, the light emitting function layer being located between the first electrode and the second electrode, and the connection electrode being located in the light emitting function layer.

Optionally, the capsule structure comprises the conductive liquid and a casing encapsulating the conductive liquid; the casing is made of an epoxy resin or a polyacrylic resin; and the conductive liquid is a liquid metal, a metal oxide conductive liquid, or a nanoparticle conductive liquid.

Optionally, expanding the capsule structure to be broken so as to enable the conductive liquid to form the connection electrode comprises: expanding the via hole to enable the capsule structure to be expanded after being heated and to generate a crack on the light emitting function layer in the via hole; and allowing the conductive liquid to flow onto the surface of the auxiliary electrode after the capsule structure is broken and to flow onto the surface of the light emitting function layer along the crack, so as to form the connection electrode connected to the auxiliary electrode in the light emitting function layer.

Optionally, the expanding comprises heating.

Optionally, the expanding comprises heating and light irradiation.

Optionally, a heating temperature during the heating is less than 100 □.

Optionally, in the heating and light irradiation, an irradiation light intensity is 100-5000 mJ/cm².

Optionally, in the heating and light irradiation, near ultraviolet light is used in the light irradiation.

In yet another aspect, there is provided a display panel, comprising an organic light emitting diode substrate, wherein the organic light emitting diode substrate comprises: a base; a pixel defining layer which is configured to define a plurality of pixel regions on the base and comprises a via hole; an auxiliary electrode whose orthographic projection region on the base is located in an orthographic projection region of the via hole on the base; a connection electrode comprising a conductive liquid; and a first electrode connected to the auxiliary electrode through the connection electrode.

DETAILED DESCRIPTION

The present disclosure will be described in further detail with reference to the accompanying drawings and embodiments. The following embodiments are intended to illustrate the present disclosure, rather than limit the scope of the present disclosure. It should be noted that, without conflicts, the embodiments of the present disclosure and the features in the embodiments may be combined in any manner.

In order to solve the problem that a connection process of a first electrode and an auxiliary electrode is poor in contact, high in production cost, likely to cause a pixel defect, and complex, the present disclosure provides a preparation method of an organic light emitting diode substrate.

Figure 1:
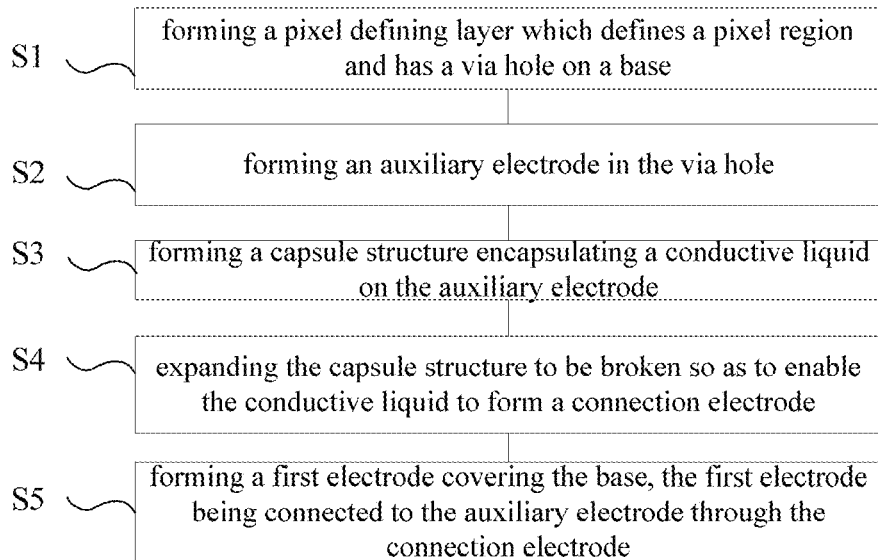
FIG. 1 is a flow chart of a preparation method of an organic light emitting diode substrate according to an embodiment of the present disclosure.

FIG. 1 is a flow chart of a preparation method of an organic light emitting diode substrate according to an embodiment of the present disclosure. As shown in FIG. 1, the preparation method of the organic light emitting diode substrate comprises:

forming a pixel defining layer which defines a pixel region and has a via hole on a base in step S1;

forming an auxiliary electrode in the via hole in step S2;

forming a capsule structure encapsulating a conductive liquid on the auxiliary electrode in step S3;

expanding the capsule structure to be broken so as to enable the conductive liquid to form a connection electrode in step S4; and forming a first electrode covering the base, the first electrode being connected to the auxiliary electrode through the connection electrode in step S5.

After step S1, the preparation method of the organic light emitting diode substrate may further comprise: forming a blocking structure in the via hole on the base, wherein the blocking structure is arranged to surround the auxiliary electrode.

Optionally, the distance from the surface of the blocking structure away from the base to the base is a first distance; the maximum distance from the surface of the capsule structure away from the base to the base is a fourth distance; and the first distance is longer than the fourth distance.

Optionally, after step S1, the preparation method of the organic light emitting diode substrate may further comprise: forming a second electrode located in the pixel region on the base; and forming a light emitting function layer on the base with the capsule structure, wherein the light emitting function layer is located between the first electrode and the second electrode; and the connection electrode is located in the light emitting function layer.

It should be noted that one of the first electrode and the second electrode may be an anode, and the other electrode may be a cathode. For example, the first electrode is a cathode and the second electrode is an anode; or the first electrode is an anode and the second electrode is a cathode, which is not limited by the embodiment of the present disclosure.

The capsule structure formed in step S3 comprises the conductive liquid and a casing encapsulating the conductive liquid. The casing may be made of an epoxy resin or a polyacrylic resin. The conductive liquid may be a liquid metal, a metal oxide conductive liquid, or a nanoparticle conductive liquid.

Alternatively, step S4 may comprise:

expanding the via hole to enable the capsule structure to be expanded after being heated and to generate a crack on the light emitting function layer in the via hole; and allowing the conductive liquid to flow onto the surface of the auxiliary electrode after the capsule structure is broken and to flow onto the surface of the light emitting function layer along the radial crack, so as to form the connection electrode connected to the auxiliary electrode in the light emitting function layer.

Optionally, the expanding comprises heating.

Optionally, a heating temperature during the heating is less than 100° C.

Optionally, the expanding comprises heating and light irradiation.

Optionally, in the heating and light irradiation, an irradiation light intensity is 100-5000 mJ/cm$^2$.

Optionally, near ultraviolet light is used in the light irradiation.

Optionally, the wavelength of light used in the light irradiation is 395 nm.

In the preparation method of the organic light emitting diode substrate provided by the embodiments of the present disclosure, the connection electrode is formed through the capsule structure encapsulating the conductive liquid, so that the first electrode is connected to the auxiliary electrode through the connection electrode. The preparation process is simpler and the production cost is lower. Moreover, the connection reliability between the first electrode and the auxiliary electrode is higher. Compared with the prior art using a laser method, the preparation method simplifies the process, overcomes the defect of poor contact, and avoids a pixel defect caused by a carbide after laser irradiation.

The technical solutions of the embodiments of the present disclosure are further described below through the preparation process of the organic light emitting diode substrate.

FIGS. 2-10 are schematic views showing the preparation of an organic light emitting diode substrate according to an embodiment of the present disclosure. The term "patterning process" in the embodiment of the present disclosure comprises depositing a film layer, coating a photoresist, exposing a mask, developing, etching, peeling the photoresist, and other steps, and is an existing mature preparation process. The depositing may be implemented through a known process such as sputtering, vacuum evaporation and chemical vapor deposition. The coating may be implemented through a known coating process. The etching may be implemented through a known method. Those are not specifically limited herein.

Figure 2:
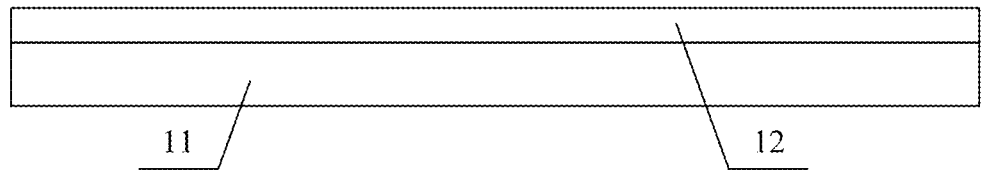
FIG. 2 is a schematic diagram after a pattern of an array structure layer is formed according to an embodiment of the present disclosure.

(1) As shown in FIG. 2, a pattern of an array structure layer 12 is formed on a base 11 through a patterning process. In the embodiment of the present disclosure, the array structure layer 12 comprises a thin film transistor (TFT). The structure and a preparation process of the array structure layer are the same as those in the prior art, which are not limited in this embodiment of the present disclosure. For example, the preparation process may comprise: cleaning a base first; and then preparing a gate electrode, an insulating layer, an active layer, source and drain electrodes, and a passivation layer on the base through the patterning process. The base may be made of glass, quartz, polyethylene terephthalate (PET), a surface-treated polymer soft film, or the like. The thin film transistor may be of a bottom gate structure or a top gate structure, and may be an amorphous silicon (a-Si) thin film transistor, a low-temperature polysilicon (LTPS) thin film transistor or an oxide thin film transistor, which is not specifically limited herein. The drain electrode of the thin film transistor is electrically connected to a second electrode. Each row of the thin film transistor is turned on gradually through a gate scanning signal. Voltage data is transmitted to the second electrode through the thin film transistor. The second electrode cooperates with the first electrode to generate a voltage difference for driving a light emitting function layer to emit light so as to achieve independent light emitting.

Figure 3:
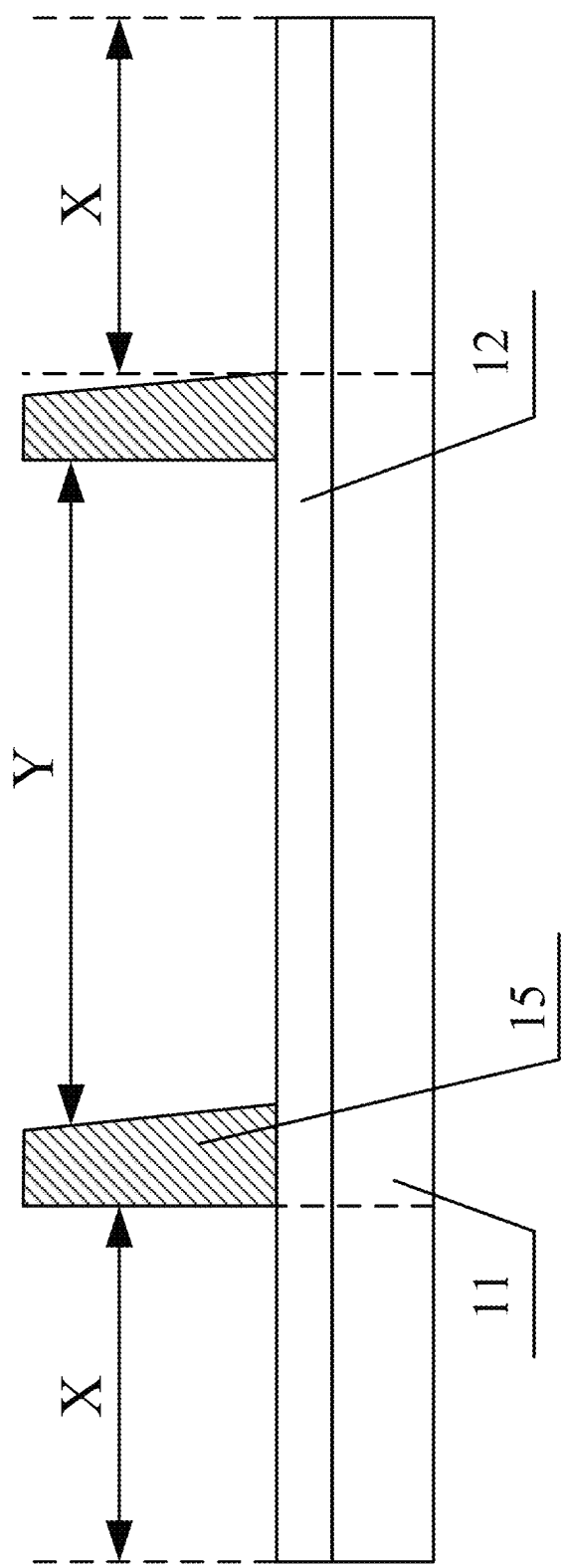
FIG. 3 is a schematic diagram after a pixel definition layer is formed according to an embodiment of the present disclosure.

(2) A pixel defining layer is formed on the base with the above structure through the patterning process. Forming the pixel defining layer comprises: depositing or coating a pixel defining thin film on the base with the above structure, wherein the pixel defining thin film may be made of polyimide, acrylic, or polyethylene terephthalate; and exposing and developing the pixel defining thin film through a monochrome mask plate to form the pixel defining layer 15 defining a pixel region X (as shown in FIG. 3). A via hole Y is formed in the pixel defining layer 15.

Figure 4:
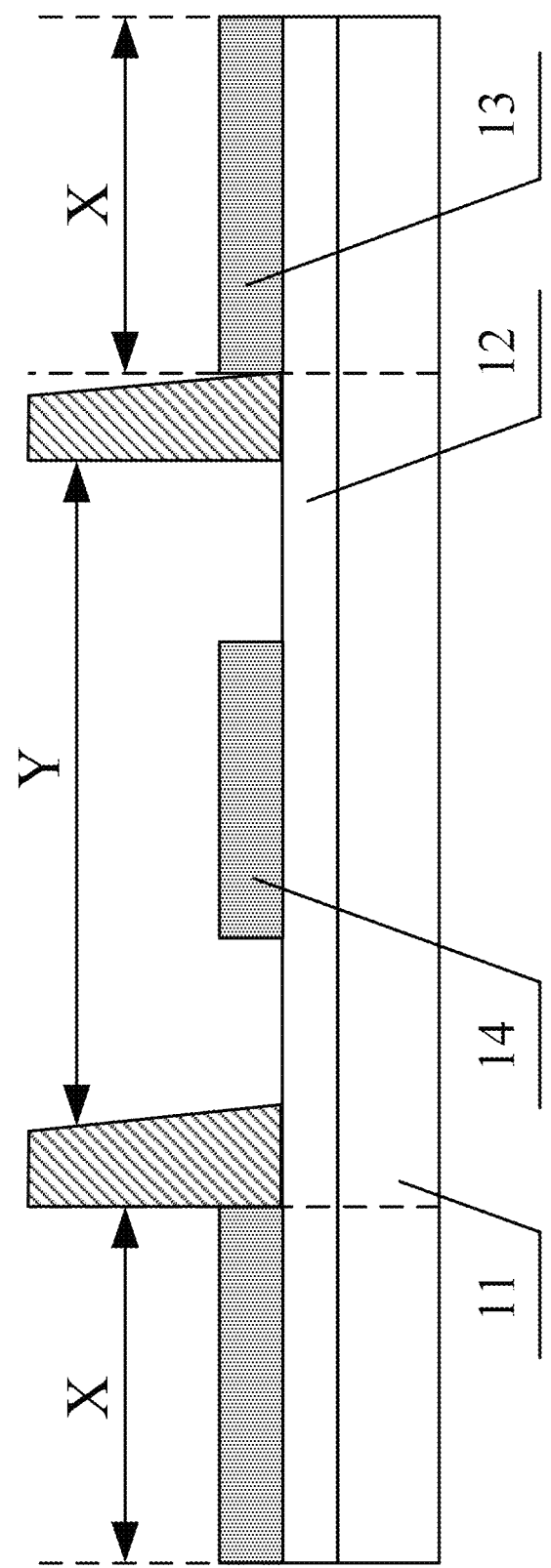
FIG. 4 is a schematic diagram after a second electrode and an auxiliary electrode are formed according to an embodiment of the present disclosure.

(3) A second electrode and an auxiliary electrode are formed on the base with the above structure. Forming the second electrode and the auxiliary electrode comprises: depositing a first metal thin film or a first transparent conductive thin film on the base with the above structure, and forming the second electrode 13 and the auxiliary electrode 14 through the patterning process, as shown in FIG. 4. It should be noted that the base is provided with a plurality of pixel regions X. The second electrode 13 may be located in the pixel region X; and the auxiliary electrode may be located in the via hole Y between the pixel regions X. That is, an orthographic projection region of the auxiliary electrode on the base is located within that of the via hole on the base. As shown in FIG. 0.3, there are two pixel regions X and one via hole Y located between the two pixel regions X. The pixel region X is a light emitting region defined by the pixel defining layer. The second electrode 13 is exposed in the pixel region X. The via hole Y is a region which is formed in the pixel defining layer and which is configured to connect the first electrode and the auxiliary electrode. The auxiliary electrode 14 is exposed in the via hole Y. It should be noted that in the embodiment of the present disclosure, forming the auxiliary electrode and the second electrode through one-step patterning process is taken as an example. In practical applications, the auxiliary electrode and the second electrode may also be formed through two patterning processes, respectively, which is not limited by the embodiment of the present disclosure.

The first transparent conductive thin film may be made of an indium tin oxide (ITO), an indium zinc oxide (IZO), or the like. The first metal thin film may be made of any of metals such as magnesium (Mg), silver (Ag), aluminum (Al) and copper (Cu), or an alloy of the above metals, or a composite layer of the above metals. The embodiment of the present disclosure does not limit a pattern of the auxiliary electrode. For example, the pattern of the auxiliary electrode may be block-shaped, strip-shaped, or grid-shaped. The auxiliary electrode 14 may be connected to a printed circuit in a non-display region on the base through a lead.

Figure 5:
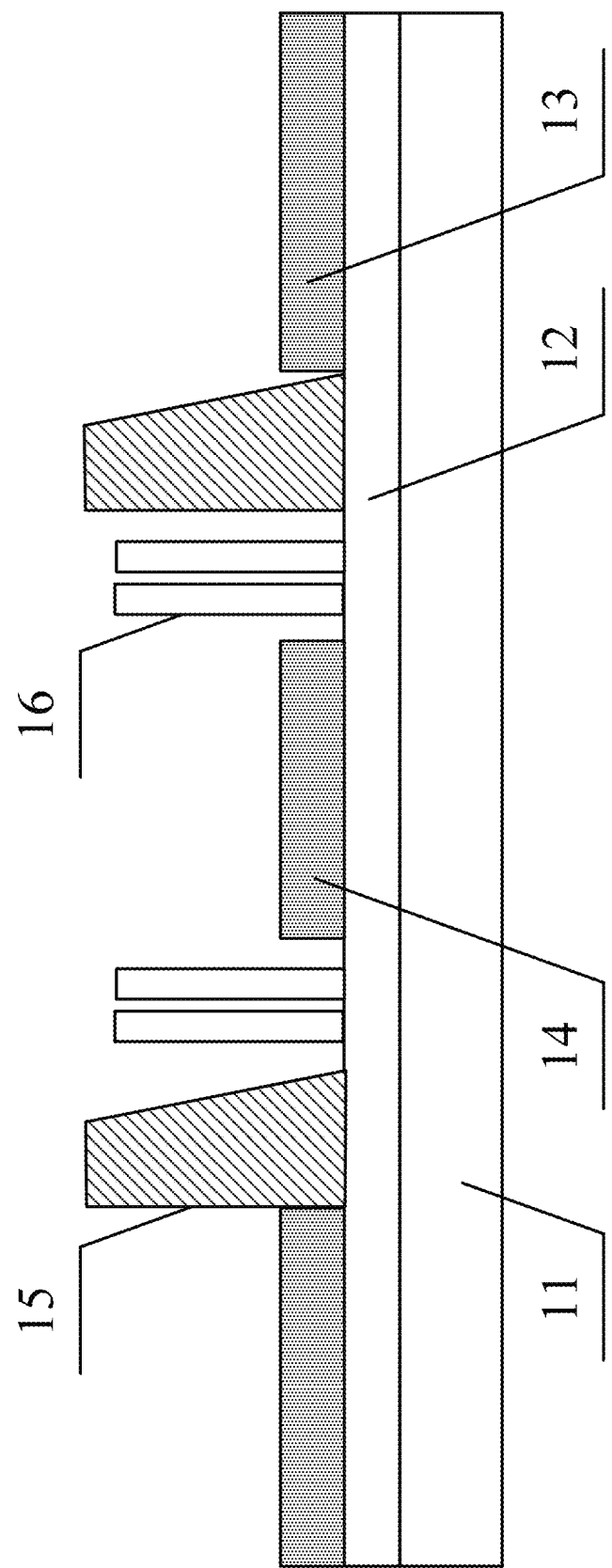
FIG. 5 is a schematic diagram after a blocking structure is formed according to an embodiment of the present disclosure.

Optionally, after the pixel defining layer is formed, as shown in FIG. 5, a blocking structure 16 may also be formed in the via hole in the array structure layer. The blocking structure 16 is also located in the via hole in the pixel defining layer, and is configured to protect the pixel region when the connection electrode is formed, so as to avoid a pixel defect likely caused by the preparation process.

Figure 6:
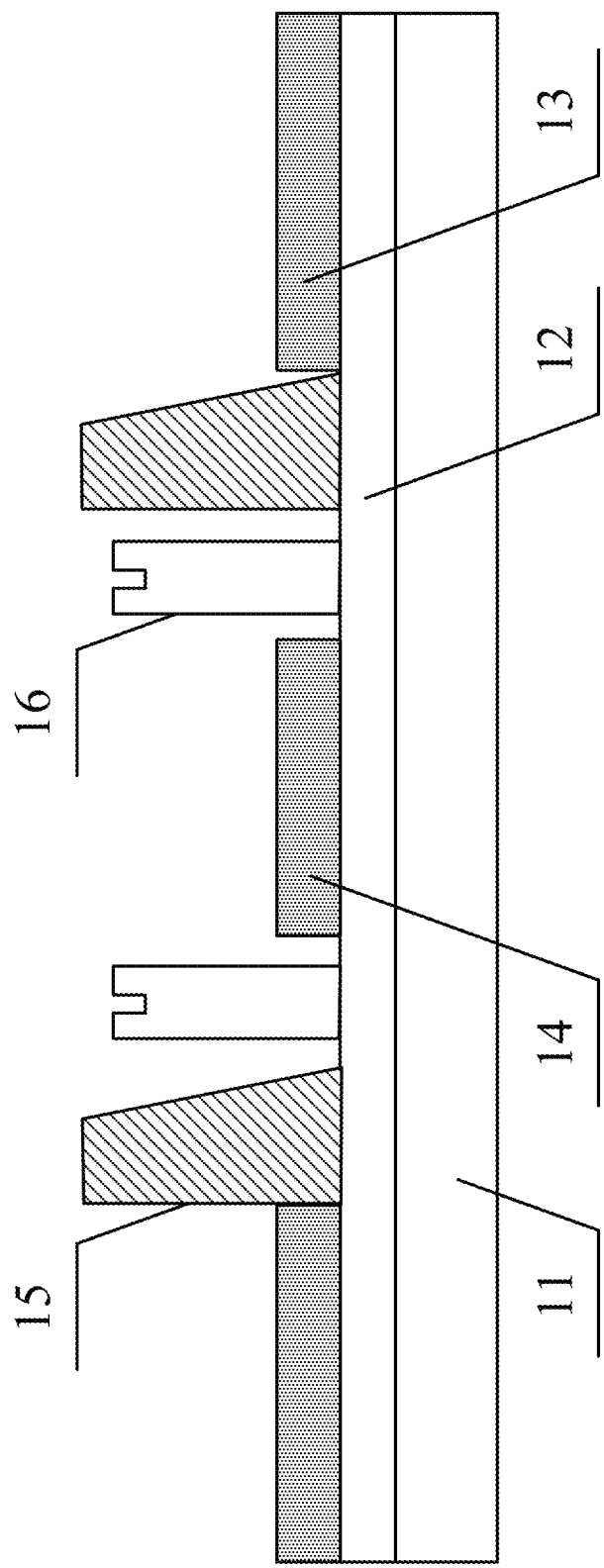
FIG. 6 is another schematic diagram after a blocking structure is formed according to an embodiment of the present disclosure.

Optionally, the blocking structure 16 may be ring-shaped and is arranged to surround the auxiliary electrode. A plurality of blocking structures in a shape of concentric rings may be formed in the via hole. In FIG. 5, for example, the surface of the blocking structure away from the base is a plane. In practical applications, as shown in FIG. 6, the surface of the blocking structure away from the base may also be concave-convex (only a ring-shaped blocking structure is shown in FIG. 6).

The blocking structure has a cross section perpendicular to the base. The cross section may be rectangular, triangular or trapezoidal. In FIGS. 5 and 6, only the rectangular cross section is taken as an example. Optionally, the aspect ratio of the rectangle may be 10:1 to 1:10.

Figure 7:
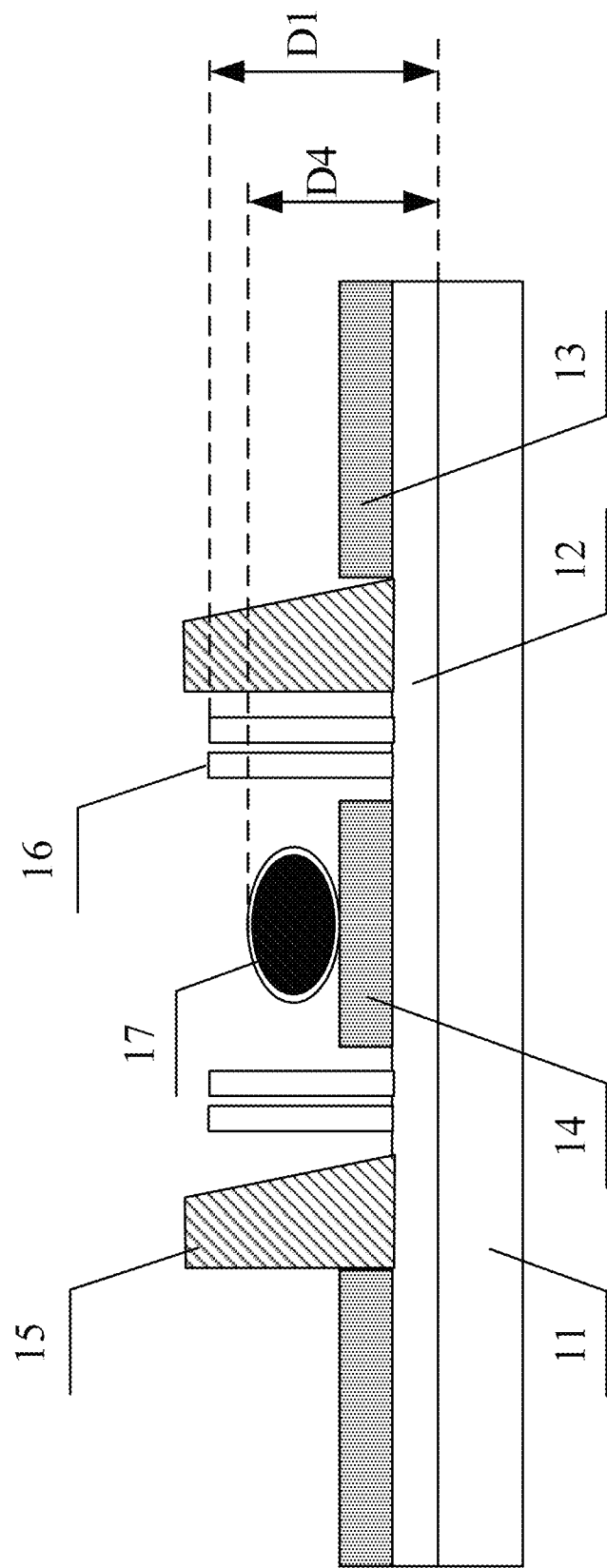
FIG. 7 is a schematic diagram after a capsule structure is formed according to an embodiment of the present disclosure.

(4) A capsule structure is formed on the auxiliary electrode. Forming the capsule structure comprises: spraying the capsule structure 17 mixed in a solution in the via hole through ink jet printing (IJP) on the base with the above structure, so as to form the capsule structure 17 on the auxiliary electrode 14, as shown in FIG. 7. The solution may be resin. The capsule structure 17 comprises a conductive liquid and a casing encapsulating the conductive liquid. The casing may be made of an epoxy resin or a polyacrylic resin, has an expansion characteristic, and may expand to be broken during expanding. The expanding may comprise heating, or may comprise heating and light irradiation. The conductive liquid may be a liquid single metal such as mercury (Hg) or gallium (Ga), or a liquid metal alloy containing mercury or gallium, or a metal oxide conductive liquid, or a nanoparticle conductive liquid.

In the embodiment of the present disclosure, the capsule structure 17 may be spherical or ellipsoidal. Optionally, the capsule structure 17 is ellipsoidal, so that the fixation of the capsule structure 17 is convenient. Here, a long axis of the capsule structure 17 is parallel to or nearly parallel to the base; and a short axis of the capsule structure 17 is 10-100 nm. Optionally, referring to FIG. 7, the distance from the surface of the blocking structure 16 away from the base 11 to the base 11 is a first distance D1; and the maximum distance from the surface of the capsule structure 17 away from the base 11 to the base 11 is a fourth distance D4. The first distance D1 is longer than the fourth distance D4. That is, the distance from the upper end surface of the capsule structure to the surface of the base is shorter than the distance from the upper end surface of the blocking structure to the surface of the base. One capsule structure 17 or a plurality of capsule structures 17 may be arranged in each via hole.

Figure 8:
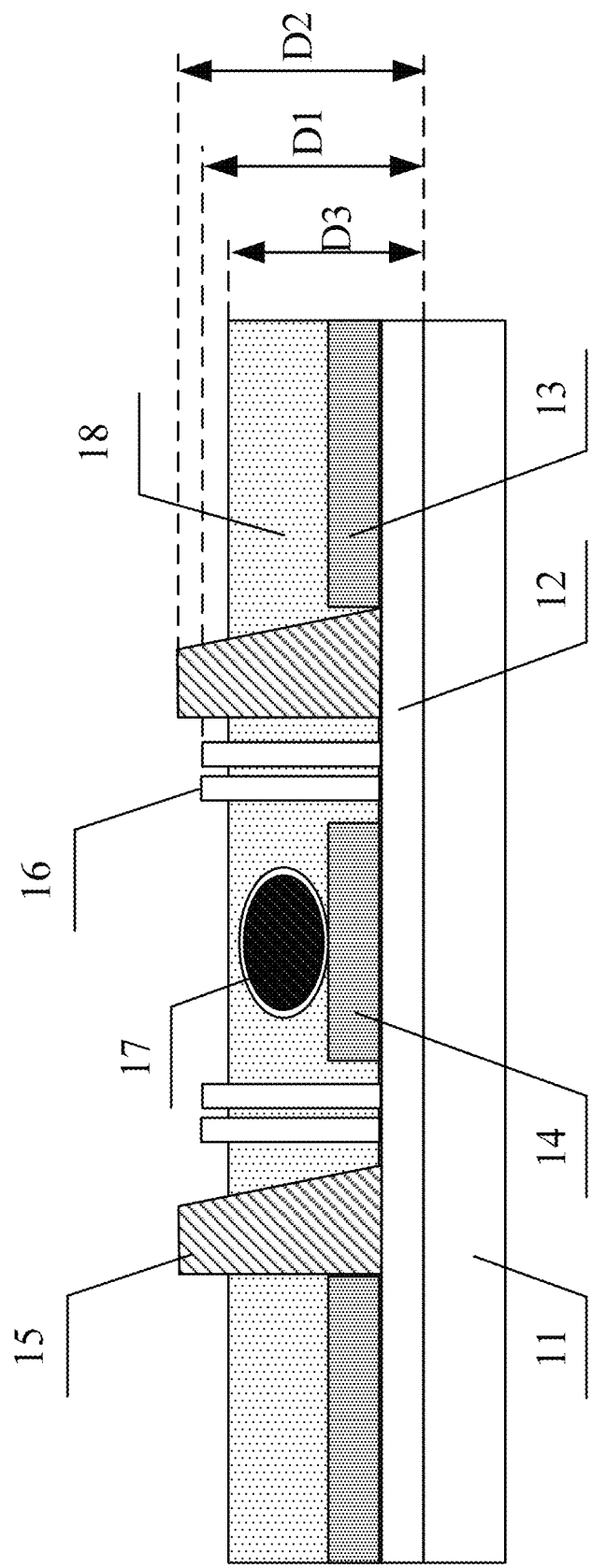
FIG. 8 is a schematic diagram after a light emitting function layer is formed according to an embodiment of the present disclosure.

(5) A light emitting function layer is formed on the base with the above structure. Forming the light emitting function layer comprises: forming the light emitting function layer 18 on the base with the above structure through coating, spin coating, or ink jet printing. The light emitting function layer 18 is formed in the pixel region and the via hole, as shown in FIG. 8. In the pixel region, the light emitting function layer 18 covers the second electrode 13. In the via hole, the light emitting function layer 18 covers the capsule structure 17. The distance from the surface of the blocking structure 16 away from the base 11 to the base 11 may be the first distance D1. The distance from the surface of the pixel defining layer 15 away from the base 11 to the base 11 may be a second distance D2. The distance from the surface of the light emitting function layer 18 away from the base 11 to the base 11 is a third distance D3. The first distance D1 is shorter than the second distance D2, and is longer than the third distance D3. That is, the distance from the upper end surface of the light emitting function layer 18 to the surface of the base is longer than the distance from the upper end surface of the capsule structure to the surface of the base, but is shorter than the distance from the upper end surface of the blocking structure to the surface of the base.

For example, the light emitting function layer 18 may comprise a hole injection layer (HIL), a hole transport layer (HTL), an electron blocking layer (EBL), an organic light emitting layer (EML), a hole blocking layer (HBL), an electron transport layer (ETL) and an electron injection layer (EIL) which are sequentially arranged in the direction from the second electrode toward the first electrode. Each layer may be made of an organic small molecule material, an organic polymer material, an inorganic material, a composite dopant material, or the like. The organic light emitting layer may be a combination of a red light emitting layer (REML), a green light emitting layer (GEML) and a blue light emitting layer (BEML), or may be a white light emitting layer (WEML) only. The structure of the light emitting function layer may also be other forms. The light emitting function layer may also be formed by other colors of light emitting layers, which is not limited herein.

Figure 9:
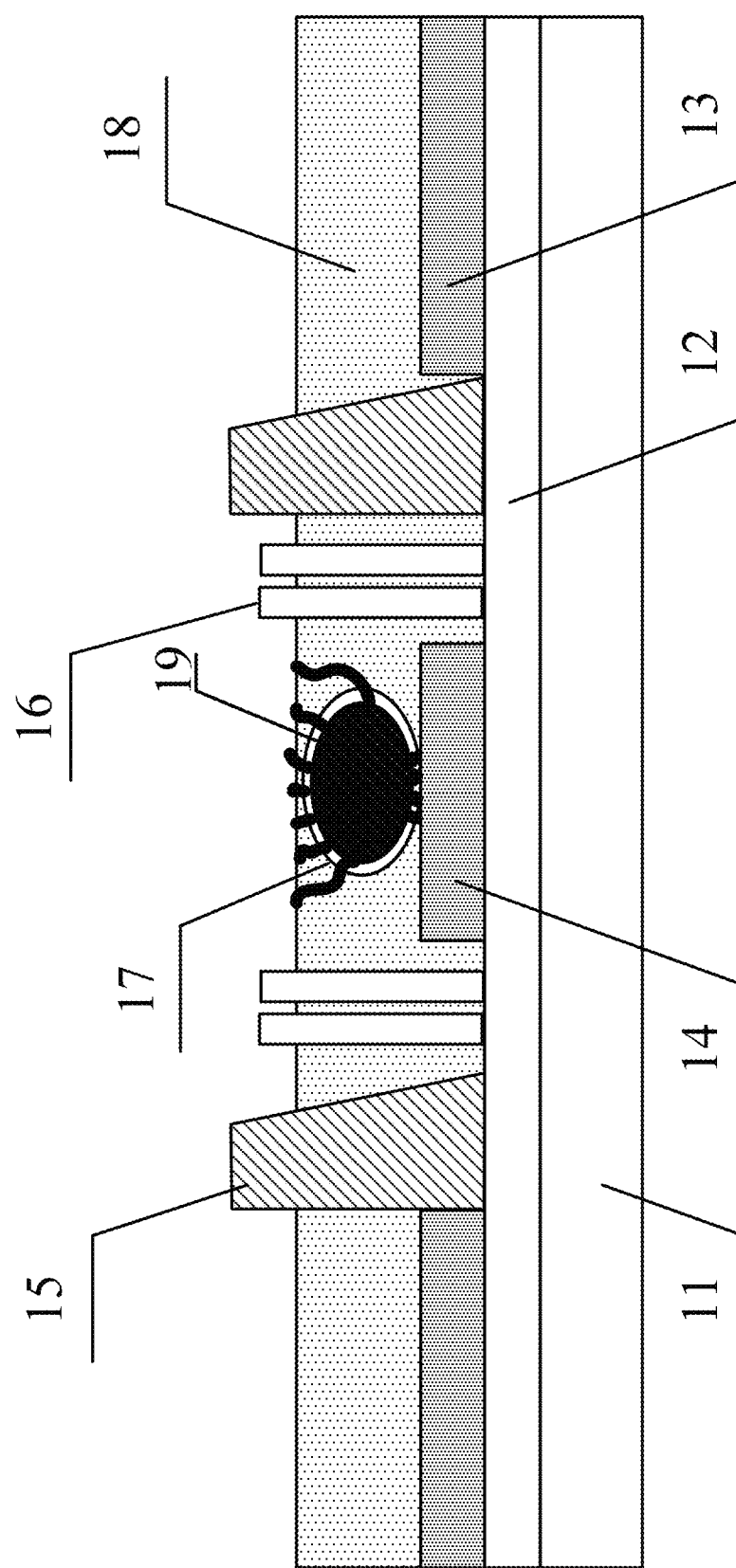
FIG. 9 is a schematic diagram after a capsule structure breaks according to an embodiment of the present disclosure.

(6) The capsule structure is subjected to expansion. For example, the base with the above structure is heated (or heated and light-irradiated) to enable the capsule structure 17 to be expanded through heat. Through the expanded capsule structure 17, a radial crack taking the capsule structure 17 as the center appears on the light emitting function layer 18 covering the capsule structure 17. Then, the capsule structure 17 expanding to a certain degree breaks; and the conductive liquid in the capsule structure 17 flows out from the broken casing, and flows in the radial crack of the light emitting function layer 18. A part of the conductive liquid flows onto the surface of the auxiliary electrode 14 away from the base, and the other part of the conductive liquid flows out of the light emitting function layer 18 to flow onto the surface of the light emitting function layer 18 away from the base along the crack, so as to form a connection electrode 19 which is connected to the auxiliary electrode 14 and covers the surface of the light emitting function layer 18 in the via hole, as shown in FIG. 9. In the embodiment of the present disclosure, a heating temperature during heating may be less than 100° C. In the heating and light irradiation, near ultraviolet light (for example, light with a wavelength of 395 nm) is used in the light irradiation; the irradiation light intensity is 100-5000 mJ/cm$^2$; and the heating temperature is less than 100° C. In a practical implementation, a corresponding heating time and irradiation time may be set according to specifications of adopted heating equipment and light irradiation equipment, so as to obtain the required heating temperature and irradiation light intensity.

Figure 10:
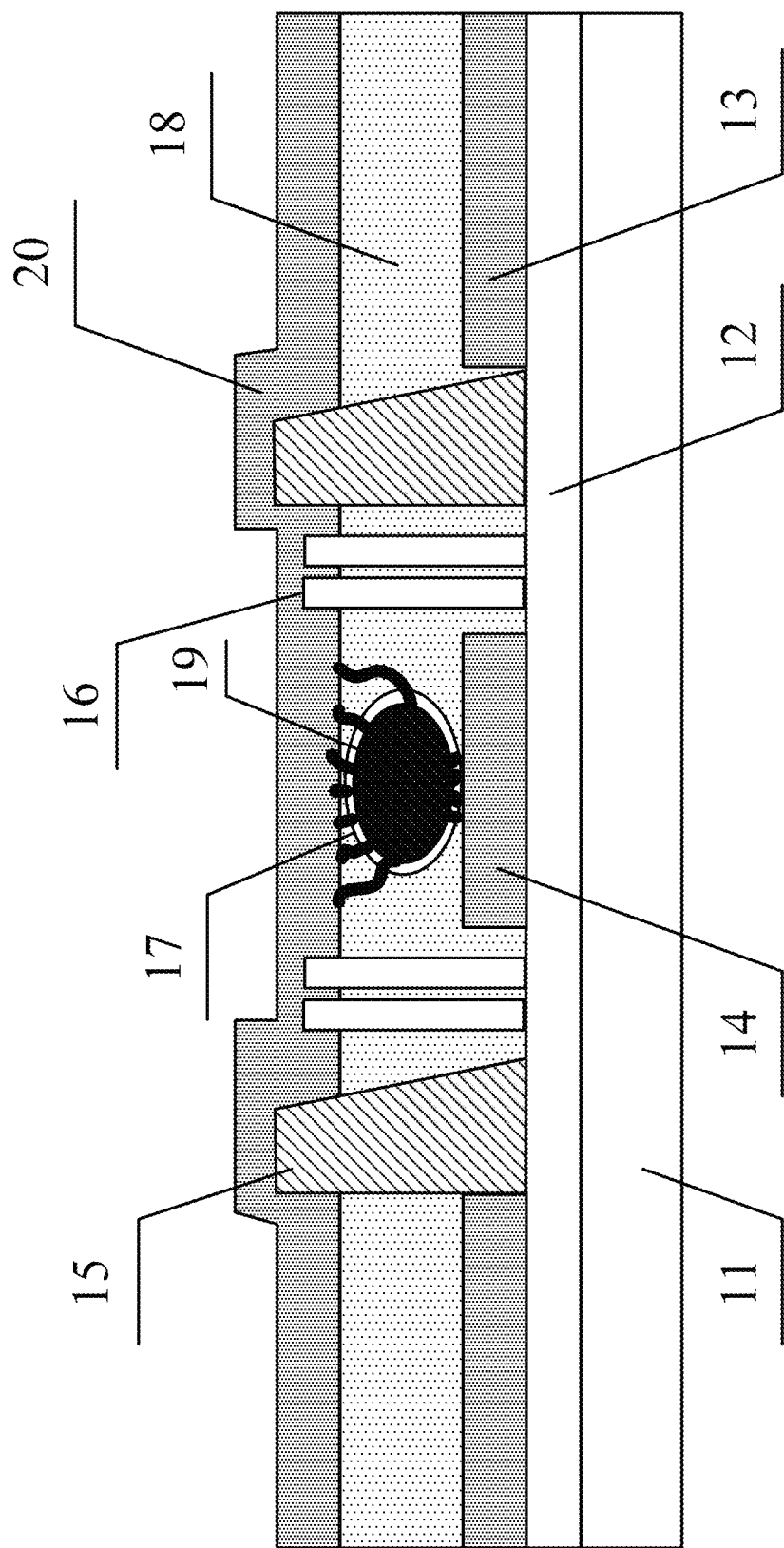
FIG. 10 is a schematic diagram after a first electrode is formed according to an embodiment of the present disclosure.

(7) A first electrode is formed on the base with the above structure. Forming the first electrode comprises: depositing a second metal thin film or a second transparent conductive thin film on the base with the above structure to form the first electrode 20 which is connected to the auxiliary electrode 14 through the connection electrode 19 in the via hole, as shown in FIG. 10. Generally, the first electrodes are connected to the same power supply voltage, in order to simplify the structure, a full surface electrode may be used as the first electrodes. The first transparent conductive thin film may be made of ITO, IZO, or the like. The second metal thin film may be made of any of metals such as magnesium (Mg), silver (Ag), aluminum (Al), copper (Cu) and lithium (Li), or an alloy of the above metals, or a composite layer of the above metals.

Subsequently, the preparation process further comprises a step of preparing an encapsulating layer on the base with the above structure, or a step of preparing a color film layer and the encapsulating layer on the base with the above structure, which is not repeated herein.

In order to connect the first electrode with the auxiliary electrode through the connection electrode and avoid the influence of the above preparation process on the pixel region, the relationship among the pixel defining layer, the blocking structure, the light emitting function layer and the capsule structure in the embodiments of the present disclosure is that the blocking structure is lower than the pixel defining layer; the capsule structure is lower than the blocking structure; and the light emitting function layer is higher than the capsule structure but is lower than the blocking structure. Exemplarily, the thickness of the blocking structure 16 in a direction perpendicular to the base is 10-100 nm.

In the embodiment of the present disclosure, the blocking structure is configured to protect the light emitting function layer in the pixel region from being influenced by a process for preparing the connection electrode. When the capsule structure expands and breaks, the conductive liquid flows onto the surface of the light emitting function layer. As the blocking structure is higher than the light emitting function layer and the surface of the blocking structure is concave-convex, the speed of the conductive liquid flowing to the pixel defining layer is slowed down, and accordingly, the length that the conductive liquid flows to the pixel defining layer is increased. Even if a part of the conductive liquid flows to the pixel defining layer, it can be ensured that the conductive liquid will not flow into the pixel region as the pixel defining layer is higher than the blocking structure. Thus, a pixel defect likely caused by the preparation process is effectively avoided. In addition, the blocking structure can also prevent the crack in the light emitting function layer from expanding to the pixel region when the capsule structure expands.

In the structure of the top-emission OLED substrate provided by the embodiment of the present disclosure, the first electrode is connected to the auxiliary electrode there below through the conductive liquid in the via hole of the pixel defining layer. On one hand, a parallel structure is formed after the first electrode and the auxiliary electrode are connected, so that a surface resistance of the thinner first electrode is reduced, and a problem of voltage drop of the first electrode is solved. Therefore, the voltage distribution of the first electrodes is uniform; and thus, an obvious non-uniform light emitting phenomenon of the top-emission OLED is avoided. On the other hand, as the auxiliary electrode is arranged in a region where the via hole is located in the pixel defining layer and the connection electrode for connecting the auxiliary electrode and the first electrode are also arranged in this region, the connection among the auxiliary electrode, the connection electrode and the first electrode does not occupy a light emitting region (namely, the pixel region), and accordingly, does not affect an aperture ratio of a pixel. In an existing structure, generally, the first electrodes adopt an overall thin film structure. Since the thinner film is larger in resistance, a peripheral driving circuit needs to apply a higher voltage so as to ensure voltages of the first electrodes located in a central display region. In addition, voltages on the first electrodes are also different due to different locations of pixel regions, resulting in non-uniform voltage distribution. In the embodiment of the present disclosure, the auxiliary electrode is provided; and the thicker auxiliary electrode functions as a transmission line. The voltage of the peripheral driving circuit is guided near to each first electrode and then is transmitted to the first electrode, so that the voltages on all the first electrodes are the same. Thus, the voltage distribution is uniform, and the brightness uniformity is higher. Meanwhile, problems of voltage rise and increased power consumption are solved. The first electrode can be designed to be very thin as the auxiliary electrode functioning as a transmission line is arranged, so as to improve the light transmittance to the greatest extent.

It can be seen from the above preparation process that the connection electrode for connecting the first electrode and the auxiliary electrode provided by the embodiment of the present disclosure is prepared by heating the capsule structure. As the capsule structure is formed through ink jet printing, an additional mask plate is eliminated. The preparations of other film layers are the same as those in the prior art. Thus, the preparation method provided by the embodiments of the present disclosure has minor modifications to the existing process, is simpler in preparation process, more convenient to implement, lower in production cost, and especially suitable for large-size OLED panels, and thus has a wider application prospect. Meanwhile, the conductive liquid formed after heating the capsule structure has a high penetrating power; the connection between the connection electrode and the auxiliary electrode is reliable; the flatness of the conductive liquid formed on the surface of the light emitting function layer is excellent; the connection between the connection electrode and the first electrode is reliable; and poor connection between the first electrode and the auxiliary electrode is avoided. Compared with an existing laser method, defects such as a complex process, high production cost and poor contact are overcome; and moreover, a pixel defect caused by a carbide after laser irradiation is avoided.

As shown in FIG. 10, an organic light emitting diode substrate prepared by the preparation method provided by the embodiments of the present disclosure comprises:

a base 11;

an array structure layer 12 arranged on the base 11; and a second electrode 13, an auxiliary electrode 14, a pixel defining layer 15, at least one blocking structure 16, a connection electrode 19 and a light emitting function layer 18 which are arranged on the array structure layer 12, wherein the pixel defining layer 15 is configured to define a plurality of pixel regions on the base 11, and comprises a via hole; the second electrode 13 is located in the pixel region X on the base; both the auxiliary electrode 14 and the blocking structure 16 are located in the via hole; the blocking structure 16 is arranged to surround the auxiliary electrode 14; and the connection electrode 19 is arranged on the auxiliary electrode 14, is located in the light emitting function layer 18, and comprises a conductive liquid.

The organic light emitting diode further comprises a first electrode 20 arranged on the light emitting function layer 18. The first electrode 20 is connected to the auxiliary electrode 14 through the connection electrode 19. The light emitting function layer 18 is located between the second electrode 13 and the first electrode 20.

Optionally, the at least one blocking structure 16 comprises a plurality of blocking structures 16 arranged in a shape of concentric rings. The distance from the surface of the blocking structure 16 away from the base 11 to the base 11 is a first distance. The distance from the surface of the pixel defining layer 15 away from the base 11 to the base 11 is a second distance. The distance from the surface of the light emitting function layer 18 away from the base 11 to the base 11 is a third distance. The first distance is longer than the third distance and is shorter than the second distance. The surface of the blocking structure 16 away from the base 11 is concave-convex. The thickness of the blocking structure 16 in a direction perpendicular to the base 11 is 10-100 nm.

Based on the technical conception of the embodiments of the present disclosure, the OLED substrate and the preparation method thereof described above may be expanded to form a plurality of related technical solutions.

For example, the second electrode and the auxiliary electrode may be formed in different patterning processes according to different array structure layers. For instance, after a gate electrode, an insulating layer, an active layer, source and drain electrodes, and a passivation layer are prepared, the second electrode (a pixel electrode) is directly formed; then, a planarization layer is formed; and an auxiliary electrode is formed on the planarization layer.

For another example, when the pixel defining layer is formed, the blocking structure may not be formed if the height of the pixel defining layer is enough to protect the light emitting function layer in the pixel region from being influenced by a process for preparing the connection electrode. In addition, patterns of the pixel defining layer and the blocking structure may be simultaneously formed or respectively formed. When the patterns of the pixel defining layer and the blocking structure are respectively formed, the blocking structure may be formed in the via hole by spraying an ester material through IJP after the pixel defining layer is formed. Or, the blocking structure may be formed through partial deposition and etching, and may be made of a silicon nitride (SiNx), a silicon oxide (SiOx), or the like.

The embodiments of the present disclosure further provide a display panel comprising the organic light emitting diode substrate with the top-emission structure provided by the above embodiments. The display panel may be a cell phone, a tablet computer, a TV, a display, a notebook computer, a digital photo frame, a navigator, or any other product or component having a display function.

In the description of the embodiments of the present disclosure, it should be understood that orientations or position relationships indicated by the terms "middle", "upper", "lower", "front", "rear", "vertical", "horizontal", "top", "bottom", "internal", "external", and the like are those based on the drawings, and are merely configured to describe the present disclosure conveniently and simplify the description, rather than indicating or implying that the referred device or element must has a specific orientation and must be configured and operated at the specific orientation. Therefore, they should not be construed as limiting the present disclosure.

In the description of the embodiments of the present disclosure, it should be noted that the terms "mounted", "connected with" and "connected to" should be broadly understood unless explicitly defined or limited otherwise. For example, they may refer to a fixed connection, detachable connection or integrated connection, or may be a mechanical connection or electrical connection, or may refer to a direct connection or an indirect connection via an intermediary, or may be an internal communication of two elements. An ordinary person skilled in the art may understand the specific meanings of the above terms in the present disclosure based on specific situations.

Although the embodiments disclosed by the present disclosure are shown as above, the contents are merely embodiments for facilitating the understanding of the present disclosure and are not intended to limit the present disclosure. Any person skilled in the art may make any modifications and variations to the implementations in the forms and details without departing from the spirit and scope disclosed in the present disclosure. The patent protection scope of the present disclosure still should be subject to the protection scope defined by the claims.

What is claimed is:

1. A preparation method of an organic light emitting diode substrate, the method comprising:
   forming a pixel defining layer which defines a pixel region and has a via hole on a base;
   forming an auxiliary electrode in the via hole;
   forming a capsule structure encapsulating a conductive liquid on the auxiliary electrode;
   expanding the capsule structure to be broken so as to enable the conductive liquid to form a connection electrode; and
   forming a first electrode covering the base, the first electrode being connected to the auxiliary electrode through the connection electrode.

2. The preparation method of claim 1, wherein after forming the pixel defining layer which defines the pixel region and has the via hole on the base, the method further comprises:
   forming a blocking structure in the via hole on the base, wherein the blocking structure is arranged to surround the auxiliary electrode.

3. The preparation method of claim 2, wherein the distance from the surface of the blocking structure away from the base to the base is a first distance; the distance from the surface of the capsule structure away from the base to the base is a fourth distance; and the first distance is longer than the fourth distance.

4. The preparation method of claim 1, wherein after forming the pixel defining layer which defines the pixel region and has the via hole on the base, the method further comprises:
   forming a second electrode located in the pixel region on the base; and
   forming a light emitting function layer on the base with the capsule structure, the light emitting function layer being located between the first electrode and the second electrode, and the connection electrode being located in the light emitting function layer.

5. The preparation method of claim 1, wherein the capsule structure comprises the conductive liquid and a casing encapsulating the conductive liquid; the casing is made of an epoxy resin or a polyacrylic resin; and the conductive liquid is a liquid metal, a metal oxide conductive liquid, or a nanoparticle conductive liquid.

6. The preparation method of claim 4, wherein expanding the capsule structure to be broken so as to enable the conductive liquid to form the connection electrode comprises:
   expanding the via hole to enable the capsule structure to be expanded after being heated and to generate a crack on the light emitting function layer in the via hole; and
   allowing the conductive liquid to flow onto the surface of the auxiliary electrode after the capsule structure is broken and to flow onto the surface of the light emitting function layer along the crack, so as to form the connection electrode connected to the auxiliary electrode in the light emitting function layer.

7. The preparation method of claim 6, wherein the expanding comprises heating.

8. The preparation method of claim 6, wherein the expanding comprises heating and light irradiation.

9. The preparation method of claim 7, wherein a heating temperature during the heating is less than 100° C.

10. The preparation method of claim 8, wherein in the heating and light irradiation, an irradiation light intensity is 100-5000 mJ/cm2.

11. The preparation method of claim 8, wherein in the heating and light irradiation, near ultraviolet light is used in the light irradiation.

\* \* \* \* \*